United States Patent [19]
Bhandari et al.

[11] Patent Number: 6,001,172
[45] Date of Patent: Dec. 14, 1999

[54] APPARATUS AND METHOD FOR THE IN-SITU GENERATION OF DOPANTS

[75] Inventors: Gautam Bhandari, Danbury, Conn.; W. Karl Olander, Indian Shore, Fla.; Michael A. Todd, Danbury, Conn.; Timothy Glassman, Millshora, Oreg.

[73] Assignee: Advanced Technology Materials, Inc., Danbury, Conn.

[21] Appl. No.: 08/906,039

[22] Filed: Aug. 5, 1997

[51] Int. Cl.$^6$ .................................................. C30B 25/14
[52] U.S. Cl. .............................. 117/84; 117/99; 117/105; 118/715
[58] Field of Search ................................. 117/84, 105, 99; 118/715

[56] References Cited

U.S. PATENT DOCUMENTS

| | | |
|---|---|---|
| 3,856,585 | 12/1974 | Moon et al. ............................. 117/99 |
| 4,496,843 | 1/1985 | Kirita et al. . |
| 4,689,094 | 8/1987 | Van Rees et al. ........................ 117/99 |
| 5,202,283 | 4/1993 | Younger et al. ......................... 117/99 |
| 5,250,135 | 10/1993 | Moss et al. ............................... 117/99 |
| 5,294,285 | 3/1994 | Kanai et al. .............................. 117/99 |

*Primary Examiner*—Robert Kunemund
*Attorney, Agent, or Firm*—Steven J. Hultquist; Oliver A.M. Zitman

[57] ABSTRACT

A method and apparatus for generating a dopant gas species which is a reaction product of a metal and a gas reactive therewith to form the dopant gas species. A source mass of metal is provided and contacted with the reactive gas to yield a dopant gas species. The dopant gas species may be passed to a chemical vapor deposition reactor, or flowed to an ionization chamber to generate ionic species for ion implantation.

37 Claims, 3 Drawing Sheets

APPARATUS AND METHOD FOR THE IN-SITU GENERATION OF DOPANTS

BACKGROUND OF THE INVENTION

1. Field of the Invention

This invention relates to apparatus and method for the in-situ generation of dopants for manufacture of microelectronic devices, and more specifically the invention relates to delivering dopants in a simple, ready and effective manner to the deposition site, e.g., a chemical vapor deposition chamber or an ion implant device.

2. Description of the Related Art

In the manufacture of semiconducting materials and semiconductor devices, a variety of gaseous compounds, e.g., arsine, phosphine, hydrogen selenide, hydrogen telluride, tetrafluorogermanium, trifluoroantimony, trichloroindium, and other fluoride species, are employed as dopant source materials.

These dopant source materials typically are delivered as gaseous components in a carrier gas stream, such as nitrogen, helium, argon or other suitable gas, and the dopant then may be introduced to the material to be doped, as for example by MOCVD or ion implantation techniques. In ion implantation, the dopant species-containing gas stream is flowed into an arc chamber of the ion implanter device, to generate the ionic dopant species which are directed to the substrate for dopant implantation.

The above-mentioned gaseous compounds utilized as dopants are hazardous in character, and due to health and safety considerations, must be carefully handled in the semiconductor manufacturing facility.

In conventional practice, dopant species may be supplied in the semiconductor manufacturing plant as gaseous compounds dispensed from high pressure gas cylinders. With such high pressure gas cylinders, there is the associated danger of cylinder rupture, resulting in gross introduction of the hazardous gas into the ambient environment of the manufacturing facility. There is also a danger of leakage from such high pressure gas cylinders, due to defects and to damage to the cylinder heads, gas flow regulators, and associated flow circuitry.

As an example of the foregoing deficiencies of the use of high pressure gas cylinders, arsine is employed in the manufacture of silicon-based semiconductor devices as a dopant source material, for arsenic doping of epitaxial semiconductor films, at relatively low concentrations, on the order of from about 20 to about 100 ppm. Even though utilized in dilute gas mixtures for such applications, the arsine is typically provided in bulk pure form in high pressure gas cylinders, which as indicated entails the risk of rupture of and/or leakage from the cylinders, with the consequence of release of arsine into the surrounding environment in the manufacturing plant.

As an alternative to the conventional requirement of high pressure gas cylinders of arsine or other dopant source gases in the semiconductor manufacturing plant, it would be desirable to provide a liquid source compound for dopants such as arsenic, selenium, tellurium, etc., which would obviate such requirement.

Unfortunately, however, no suitable liquid source compounds for such dopants have been produced which yield semiconductor materials having desired superior electrical and structural properties.

The art has sought various solutions to this problem.

U.S. Pat. No. 5,518,528 issued May 21, 1996 to Glenn M. Tom and James V. McManus describes a storage and delivery system for gases, in which the gas to be dispensed is adsorbed on a physical sorbent medium and selectively dispensed by pressure differential desorption of the sorbate gas from the sorbent material.

U.S. Pat. No. 4,936,877 issued Jun. 26, 1990 to Steven J. Hultquist and Glenn M. Tom describes a dopant delivery system for semiconductor manufacture, in which a carrier gas is flowed through a contacting zone containing a permeable film through which the vapor-phase dopant constituent permeates into the contacting zone, to yield a product gas mixture comprising the vapor-phase constituent in the carrier gas.

It would be an advance in the art to provide an effective system for the on-site generation of dopant gas species.

It therefore is an object of the present invention to provide means and method for on-site generation of dopant gas species, which are of a simple, ready and efficient character.

It is another object of the present invention to provide an ion implantation system including in-situ generation of dopant gas species for the ion implantation process.

Other objects and advantages of the present invention will be more fully apparent from the ensuing disclosure and appended claims.

SUMMARY OF THE INVENTION

The present invention relates to apparatus and method for generating a dopant gas species. Such dopant gas species may be utilized in any of various conventional ways, e.g., flow of the dopant species in a carrier gas stream to a chemical vapor deposition chamber for the fabrication of a silicon-based semiconductor, wherein the dopant element is deposited together with a suitable source reagent for epitaxial film formation on a semiconductor substrate. Alternatively, the dopant species-containing gas stream may be passed to an ionization chamber of an ion implant device, for generation of ionic dopant species which are then directed at the substrate in which the dopant is to be incorporated.

More specifically, the invention relates in one aspect to a system for generating a dopant gas species which is a reaction product of a metal and a gas reactive with the metal to form such dopant gas species.

The system may suitably comprise:

a source mass of the metal; and means for (i) flowing the reactive gas in contact with the source mass of the metal to effect reaction and generate the dopant gas species, and (ii) recovering the dopant gas species.

The means (i), (ii) may suitably comprise a reaction chamber holding the source mass of the metal, ancillary piping or other flow passages, manifolds, and recovery vessels. The means may be widely varied to provide the requisite structure to effect gas/metal contacting and production of the dopant gas species. The means for recovering the dopant gas species may for example comprise a cold trap or means for isolating and/or concentrating, or otherwise yielding the product dopant gas species.

In another aspect, the invention relates to a method for generating a dopant gas species, comprising;

providing a source mass of a metal;

flowing a reactive gas in contact with the metal source mass to effect reaction therebetween and generate the dopant gas species; and recovering the dopant gas species.

In another aspect of the invention, the dopant gas species generated by the means and methods described above are flowed to a chemical vapor deposition chamber for incorporation in an epitaxially grown film.

Alternatively, the dopant gas species may be passed to the ionization chamber of an ion implant apparatus, for generation of ionic dopant species and directing of such species to a substrate positioned to receive same.

The source mass of the metal in the apparatus and method described above may be heated to facilitate the reaction between the metal and gas. Such heating may be carried out in any suitable manner, as for example by resistance heating of the source mass of the metal itself, or by radiant heating, radio frequency heating, convective heating or other conductive heating.

As another approach for facilitating the reaction of the metal and the gas, the metal mass may be provided in a high-surface area conformation, such as in the form of a wire mesh body, a sponge or a gauze structure.

The invention in another aspect relates to the apparatus and method described above for generating a dopant gas species, in which the source mass of metal is provided as a metal rod, over the surface of which the reactive gas is flowed. At least one rod may be provided in a gas/metal contacting chamber, and various arrangements are contemplated within the broad scope of the invention, by means of which multiple metal source masses may be selectively contacted with an etching gas, as hereinafter more fully described.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
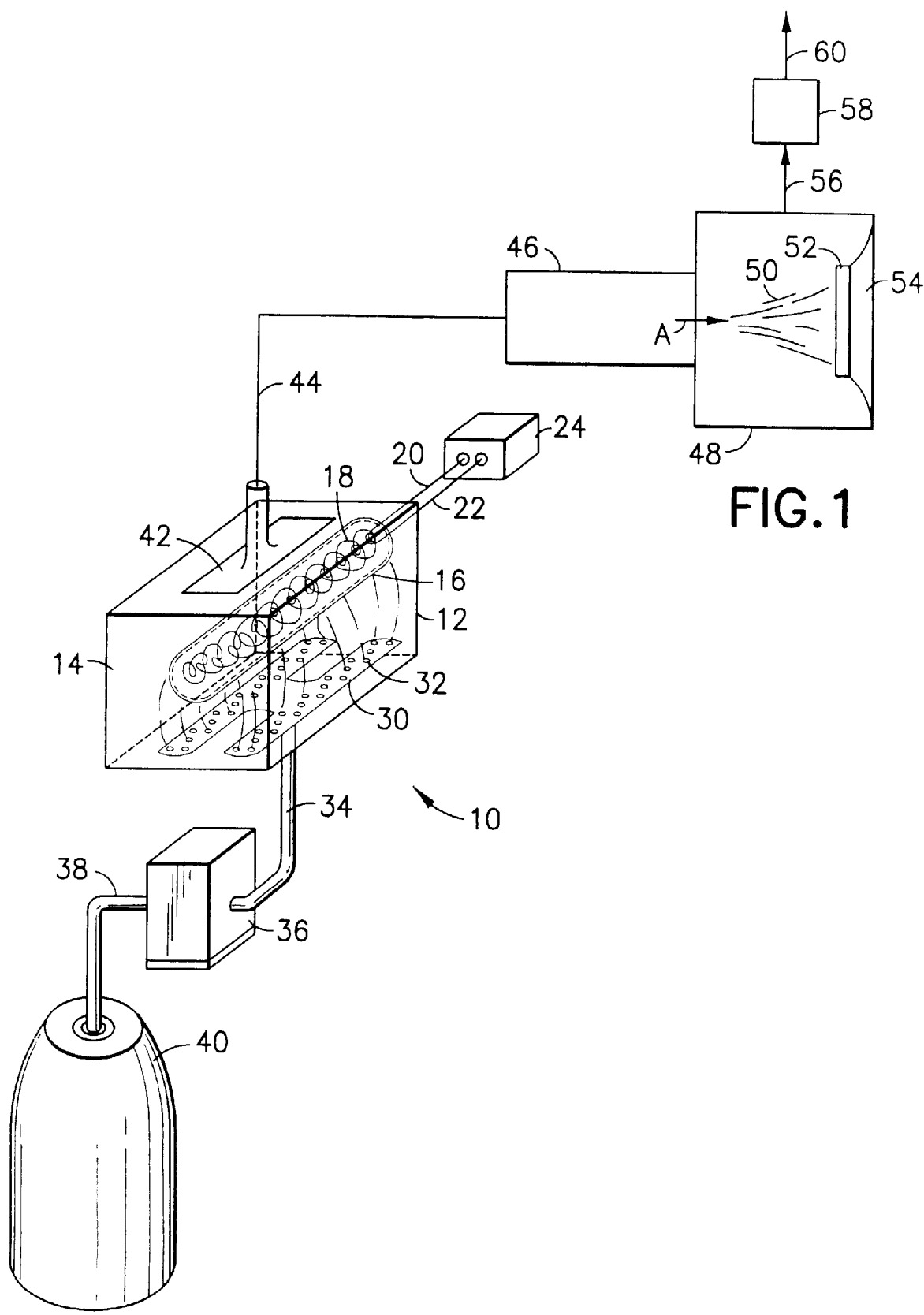
FIG. 1 is a schematic representation of a process system for the in-situ generation of a dopant gas species, and use of such species in ion implantation, according to one embodiment of the invention.

The present invention is based on the discovery that dopant gas species may be simply, readily and efficiently generated in-situ by the expedient of contacting of a reactive gas with a metal source mass which reacts with the gas to yield the dopant gas species. The term "gas," as used herein to describe the reactive gas contacted with the metal source mass, is intended to be broadly construed to include gas per se, as well as vapor (e.g., from low boiling liquid) species, as reactive fluids which are suitable in the broad practice of the present invention.

The metal source mass may be heated to elevated temperature to enhance the reaction rate of the gas/metal reaction, or preferably, if the reaction characteristics at ambient conditions are satisfactory, the metal source mass may simply be exposed to the reactive gas. The metal source mass may be a solid material or it may be a molten liquid mass.

The invention is broadly applicable to any gaseous dopant species which are suitably formed by gas/metal reaction, or to precursor compounds of active dopant species, which are decomposable or extractable at the deposition site, to provide the specific dopant component. For example, the gas/metal reaction may include reaction of a fluorine-containing gas with a metal, to generate metal fluoride compounds which may be passed in a carrier gas stream to an arc chamber of an ion implantation apparatus, where dopant species metal cations are generated and directed toward a substrate for ion implantation therein.

As a further example, the gas/metal reaction may be carried out as follows, utilizing $NF_3$ as an illustrative reactive gas and M as a generic metal species:

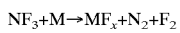

$$NF_3 + M \rightarrow MF_x + N_2 + F_2$$

The metal may as indicated be reacted at ambient (e.g., room temperature) conditions, or the metal may be heated to above-ambient temperature, as appropriate to the desired reaction product. Similar reaction schemes could be carried out with other reactant gases such as $NF_3$, $ClF_3$, $CF_3I$, $CF_3H$, $H_2$, $NH_3$, $HF$, $BF_3$, $F_2$, $Cl_2$, $SiF_4$, and mixtures of two or more species thereof, e.g., a mixture of fluorine, chlorine and hydrogen.

The metal reacted with the gas may be of any suitable type and form. For example, the metal may be in a powdered, discrete or discontinuous form (such as a frit or sintered porous disk), or may constitute a solid or composite mass (such as a molten indium rod). Heating of the metal, where employed, may be carried out in any suitable manner, using any appropriate means and methods, as well as via any useful modality of heat transfer (e.g., conductive or resistive, radiant, convective, etc.). In addition to reactive gas etching of metals per se, the invention may also be employed in the formation of non-metal dopant species by contacting a reactive gas with a source mass of the non-metallic component that is reactive with the gas to form the non-metal dopant species.

In the above-described reaction scheme, with $NF_3$ as a reactive gas, the temperature may illustratively be on the order of 300° C. or higher. In other instances, it may be desirable to utilize relatively lower temperatures (indium, for example, has a relatively low melting point). Conversely, it may be desirable in some instances to utilize the metal in a melt form, e.g., as a molten mass in a crucible with the reactant gas being flowed in contact with the melt surface to effect the gas/metal reaction.

In another embodiment, the metal can be melted in a crucible for reaction with the etch gas. For example, indium melts at 196° C. but does not volatilize significantly until about 1500° C.

The method of the invention may be carried out with any suitable flow rate and flow arrangement of the reactive gas, and with any suitable form and arrangement of the metal. The reaction system for example may contain a bulk mass of the metal source material, e.g., an ingot or boule of the metal, so that the reactive gas contacted with the bulk mass of metal etches the metal surface and yields the desired dopant gas species.

As a further embodiment of the invention, the reactive metal may be compounded, e.g., impregnated, with a reaction catalyst species which is active at elevated temperature, to facilitate the in-situ generation of the dopant species reaction gas product at such higher temperature. Alternatively, the dopant metal may be deposited on an inert support to maximize surface area of the metal, thereby increasing the rate of surface reaction.

The metal compounds produced by the gas/metal reaction may be passed to an ionization chamber (arc chamber) for ionization and generation of cationic metal dopant species. The ionic species then may be utilized in ion implantation, being directed toward a substrate disposed in an ion implant chamber to receive the ion stream.

Alternatively, the dopant species gas may be flowed to a chemical vapor deposition chamber, either as generated, or in the form of an ionized stream of the gas. Thus, ionization and use of the dopant metal ionic species in chemical vapor deposition is contemplated within the broad practice of the present invention.

The invention is applicable to the generation of a number of specific dopant gas species, including tetrafluorogermanium, trifluoroantimony, pentafluoroantimony, pentafluoroarsenic, pentafluorophosphorus, trifluoroindium, trifluoroarsine, trifluorophosphine, and trifluoroboron, among others. The reaction product fluorine compound produced by the reaction then may be dissociated or decomposed to yield the active dopant metal component.

The invention permits dopant gas species to be safely generated, without the maintenance of an inventory of the dopant gas, which would otherwise create health and safety issues, such as the prior art has variously attempted to overcome.

When gases such as fluorine compounds are employed for the gas/metal reaction, the gas may be contained and supplied in any suitable manner appropriate to its corrosive character. For example, the gas may be supplied by a sorbent-based storage and dispensing system of the type disclosed in U.S. Pat. No. 5,518,528 issued May 21, 1996 to Glenn M. Tom and James V. McManus, the disclosure of which is incorporated herein by reference in its entirety.

Fluorine-containing reaction gases may require polytetrafluoroethylene (PTFE)-lined supply vessels and connecting piping, to minimize or avoid corrosion problems. Other reaction gases may require corresponding adaptation or safeguards, but it will be recognized that such measures are more readily accommodated than the hazards associated with significant inventories of the dopant gas per se.

Referring now to the drawings, FIG. 1 shows a schematic representation of a process system for in-situ generation of dopant gas species and ion implantation of the dopant component.

The process system 10 comprises a reaction chamber 12 defining an interior volume 14 containing a metal rod 16 having imbedded therein a resistance heating coil 18. The heating coil 18 is coupled by means of leads 20 and 22 to electrical power source 24.

Disposed in the interior volume 14 of chamber 12 is a gas dispensing manifold 30 with gas flow openings 32 therein which communicate with a manifold supply line 34 joined to pump 36. The pump 36 receives reactive gas in supply line 38 from source vessel 40, which as mentioned may be protectively lined when fluorine-containing reactive gases are utilized, by e.g. copper or fluorine-resistant alloys such as Monel.

The manifold 30 is disposed at a lower portion of the reaction chamber 12. At an upper portion of the reaction chamber is disposed a gas collection manifold 42, for collection of gas/metal reaction product gases. The reaction product gases are discharged from manifold 42 into discharge line 44. From line 44, the product gases enter the arc chamber 46 associated with the ion implant vessel 48 containing a substrate element 52 positioned on mount 54 therein.

In the arc chamber 46, the reaction product gas is ionized. The resulting ion species are discharged from the arc chamber in the direction indicated by arrow A as a stream 50 of cationic metal dopant species which bombard the substrate element 52 and are imbedded in the structure of such element as doped ionic/atomic species.

The ion implantation vessel 48 discharges effluent gas in line 56 to a treatment complex 58. In the treatment complex, the effluent gas stream may be subjected to treatment, in order to remove or abate undesired components, following which the final effluent from the process system is discharged from the treatment complex in line 60.

In operation of the FIG. 1 process system, the reactive gas from source vessel 40 flows through line 38 to pump 36 and is discharged from the pump to manifold feel line 34. From manifold line 34, the reactive gas flows to the gas flow openings 32 of manifold 30, for discharge thereof into the interior volume of the gas/metal reaction chamber 12. The upflowing reactive gas then contacts the outer surface of metal rod 16, which is heated to suitable temperature by the embedded heating element 18 joined to the electrical power supply 24 via leads 20 and 22.

The reactive gas in flowing upwardly and over the exterior surface of rod 16 reacts to form the dopant gas species, which then is collected in manifold 42 and flowed in discharge line 44 to the arc chamber.

It will be recognized that form of the metal may be widely varied from the simple rod conformation shown. For example, multiple discrete elements comprising the metal may be provided in the reaction chamber. Alternatively, the reaction chamber may comprise a fluidized bed in which the metal is in discontinuous form and is fluidized by a reactive gas to form the dopant species reaction product. As a still further alternative, the metal may be provided in the form of a grate or perforate body disposed in a flow-through vessel, receiving reactive gas which is flowed through the porous metal element, to effect the gas/metal reaction.

In lieu of the single gas source shown in the FIG. 1 process system, the invention may be carried out with multiple gas sources, each feeding a common metal-containing reaction chamber, and such multiple gas sources may be co-fed to the reaction chamber, or otherwise singly or permutatively flowed, to achieve the desired dopant gas species composition.

Figure 2:
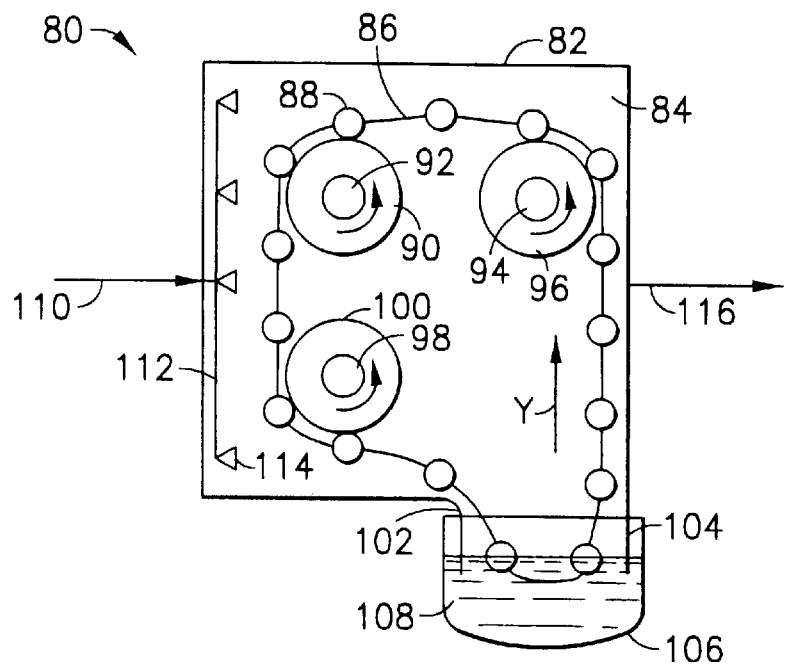
FIG. 2 is a schematic elevation view of a gas/metal contacting chamber, in which the reactive gas is flowed through a series of metal screens.

Referring now to FIG. 2, there is shown a gas/metal reaction apparatus 80 including a reaction vessel 82 defining therewithin an interior volume 84. In this interior volume a plurality of metal screens 90 arranged to extend across the flow path of the reactive gas, so as to effect gas/metal reaction as the reactive gas flows through the metal screens.

The reaction chamber 82 contains a gas distribution manifold 112 joined in closed gas flow communication with gas feed line 110. The manifold has associated therewith a plurality of nozzles 114, by which the reactive gas is distributed in the interior volume 84 of the chamber.

The reactive gas is introduced to chamber 82 in gas feed line 110 and is discharged from the manifold 112 by nozzles 114 into the interior volume of the chamber for contact with the metal screens 90. The reactive gas reacts with the metal of the screens, to yield the dopant species product gas, which is discharged from chamber 82 in product gas discharge line 116.

Figure 3:
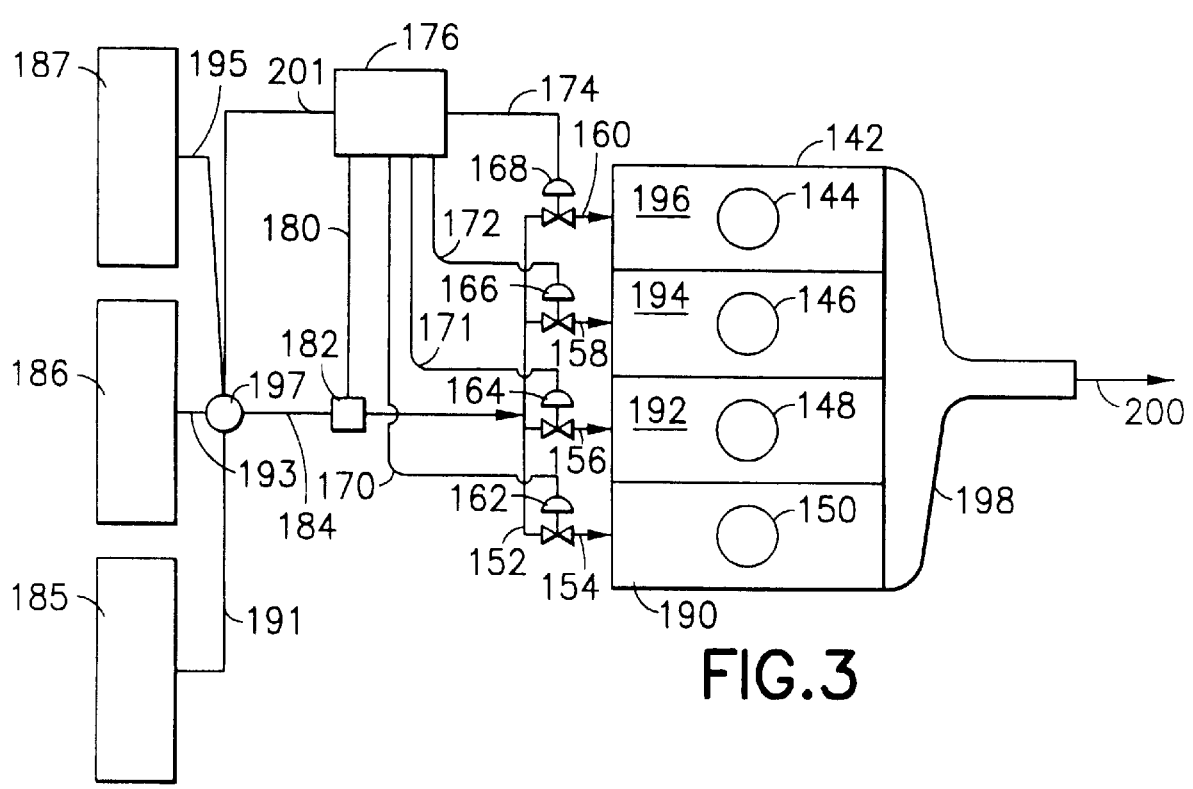
FIG. 3 is a schematic representation of a process system for contacting one or more metal source masses with various reactive gases, to generate dopant species.

FIG. 3 is a schematic representation of a process system 140 for in-situ generation of dopant species, comprising multiple metal bodies and multiple reaction gases for producing the dopant species reaction product.

The process system 140 includes a reaction chamber 142 which is partitioned into internal passages 190, 192, 194 and 196, each containing a metal body 150, 148, 146 and 144, respectively.

The downstream end of chamber 142 is joined in gas flow communication with an effluent gas collection manifold 198 which in turn discharges the reaction product gas from the process system in discharge line 200.

The upstream end of the chamber 142 is joined to a feed gas manifold 152 having branch lines 154, 156, 158 and 160 communicating with reaction chamber passages 190, 192, 194, and 196, respectively.

The manifold branch feed lines 154, 156, 158 and 160 are provided with flow control valves 162, 164, 166 and 168 therein, respectively. These flow control valves are able to be modulated between a fully opened and a fully closed condition, to flow a desired amount of gas therethrough. The flow control valves 162, 164, 166 and 168 are actuator controlled valves, coupled by signal transmission wires 170, 171, 172 and 174, respectively, to a central processing unit 176.

The central processing unit may be arranged in sensing relationship with a sensor 182 in gas feed line 184, to vary the flow through the respective passageways 190, 192, 194 and 196, in response to flow rate in gas feed line 184, as sensed by the gas flow sensor 182. The flow rate sensed by sensor 182 is transmitted by signal transmission wire 180 to the central processing unit 176, and the control signals are respectively transmitted to the valves 160, 164, 166 and 168, to open or close same to a desired extent.

The gas feed line 184 receives gas from the gas feed control valve 197 which in turn is joined by gas feed lines 191, 193 and 195 to gas source vessels 185, 186 and 187, respectively.

By the arrangement shown in FIG. 3, the gas source vessels 185, 186 and 187 may introduce gas in amounts and proportions which are controllable by the central processing unit 176 via valve signal line 201. By such arrangement, valve 197 may control feed of a gas from only one of the feed gas supply vessels, or it may control flow of mixtures of two or more gases to the passageways containing the metal bodies.

It will be appreciated that a system of the type shown in FIG. 3 may be varied widely within the broad scope of the present invention, to include other numbers of gas source vessels and/or other numbers of passageways containing metal bodies for gas/metal contacting and reaction.

The system alternatively may be otherwise arranged to accommodate multiple source gases linked with multiple masses of source metal.

Figure 4:
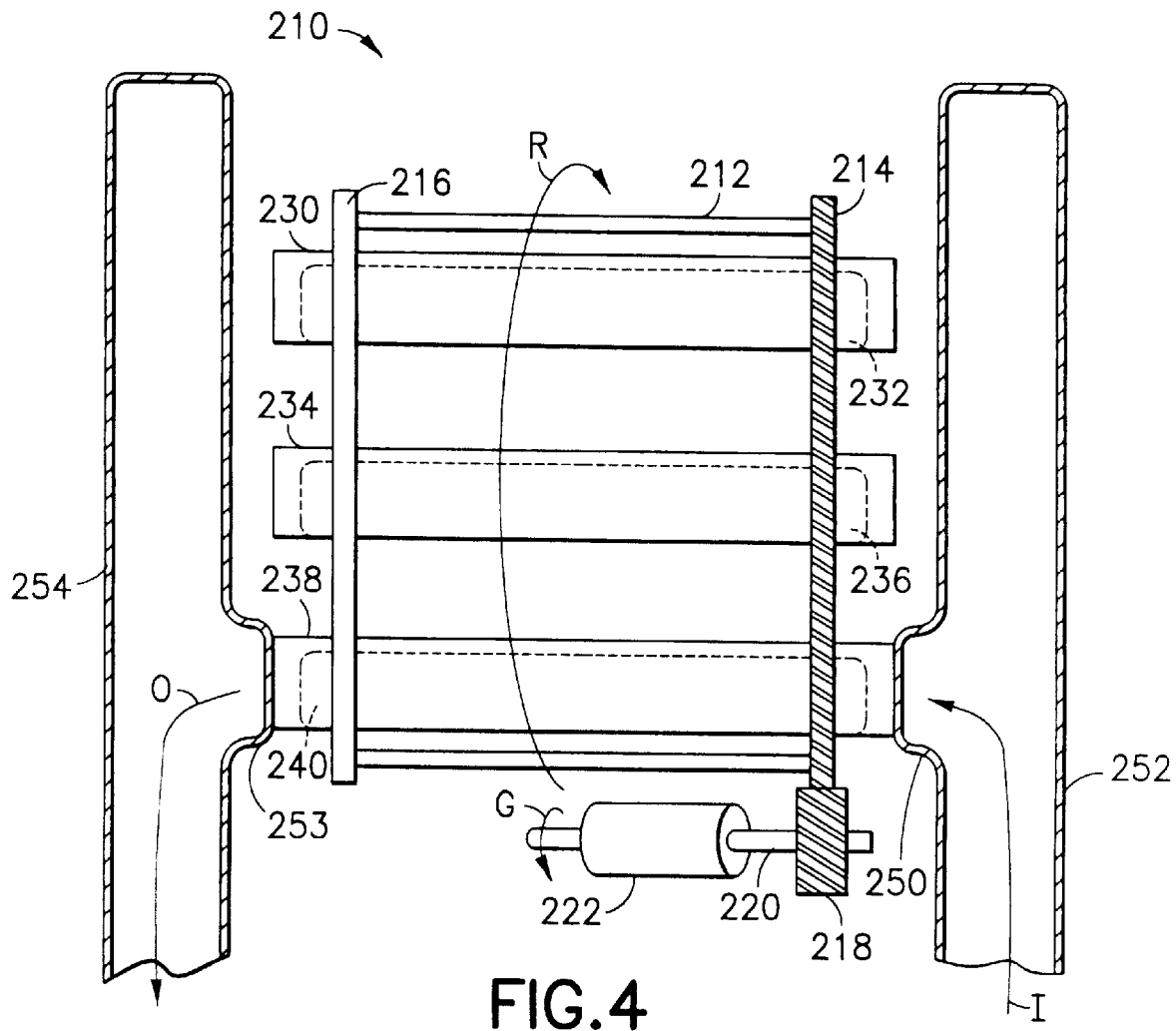
FIG. 4 is a schematic representation of a carousel apparatus having mounted thereon multiple gas/metal contact chambers containing metal source bodies.

FIG. 4 is a schematic representation of a gas/metal contact apparatus, according to another embodiment of the invention.

The FIG. 4 apparatus 210 includes a carousel 212 with end plates 214 and 216 having mounted thereon a plurality of canisters open at each of opposing ends thereof.

The canisters 230, 234 and 238 each contain a reactive metal body 232, 236 and 240, respectively.

The end plate 214 of the carousel is geared on its outer peripheral surface to mate with drive gear 218 mounted on shaft 220 and driven by drive motor 222 in the direction indicated by arrow G. Such rotation produces corresponding rotation of the carousel in the direction of arrow R.

The apparatus of FIG. 4 includes a gas feed manifold 252 having a gas feed port 250 which serially engages an open end of one of the canisters 230, 234 and 238. The port 250 may be arranged to slidingly mate with the passageway, with rotation of the carousel being temporarily suspended during flow of reactive gas through the interior volume of the canister containing the metal body that is in register with the gas feed port. Concurrently, an effluent manifold 254 comprising a receiving port 253 engages the opposite end of the canister from the end engaged with gas feed port 250. In this manner, reactive gas flows into the manifold 252 in the direction indicated by arrow I and then through canister 238 containing metal body 240, with the reaction product gas subsequently being discharged into the effluent manifold through port 253, in the direction indicated by arrow O.

By this arrangement, the reactive gas may be flowed through a given canister containing the metal body for a predetermined period of time, following which the gas flow is terminated, and the carousel rotated to the next metal body. For this purpose, the manifolds 252 and 254 may be vacuum-purged following flow of gas through a canister, in order to avoid ambient communication as the next canister is rotated into position for engagement with the respective ports of the feed and effluent manifolds.

It will be appreciated from the foregoing that the invention may be carried out in a wide variety of embodiments and apparatus and process configurations.

Accordingly, the embodiments and features described hereinabove are not intended to limit the invention, and other variations, modifications and other embodiments will suggest themselves to those of ordinary skill in the art. The invention therefore is to be broadly construed, consistent with the claims hereafter set forth.

What is claim is:

1. A system for generating a dopant gas species for doping of a substrate material, wherein the dopant gas species is a reaction product of a reactant comprising a dopant element and a gas reactive with the reactant to form the dopant gas species, said system comprising:

a source mass of said reactant, isolated from the substrate material and precursors and components thereof; and means for flowing the reactive gas in contact with the reactant mass to effect reaction and generate said dopant gas species, wherein the reactive gas contacted with the reactant mass is substantially free of any precursors or components of the substrate material.

2. A system according to claim 1, wherein said material is in the form of a solid mass or a molten liquid mass.

3. A system according to claim 1, wherein said source mass of material is disposed in a reaction chamber through which the reactive gas is flowed to effect gas/metal reaction.

4. A system according to claim 3, comprising multiple material source masses.

5. A system according to claim 1, comprising multiple reactive gases and means for flowing same separately and/or in mixture in contact with the material source mass.

6. A system according to claim 1, comprising multiple gas sources arranged to controllably mix reactive gas from said gas sources.

7. A system according to claim 1, wherein said material is selected from the group consisting of germanium, antimony, indium, and arsenic.

8. A system according to claim 1, wherein said material source mass is a metal rod, disposed in a reaction chamber, with an inlet for introducing said reactive gas to the chamber, and an outlet for discharging reaction product gas.

9. A system according to claim 1, wherein said reactive gas is selected from the group consisting of $NF_3$, $ClF_3$, $CF_3I$, $CF_3H$, $H_2$, $NH_3$, HF, $BF_3$, $F_2$, $Cl_2$, $SiF_4$, and mixtures of two or more species thereof.

10. An ion implant and dopant gas species in-situ generation system, for doping of a substrate material, wherein the dopant gas species is a reaction product of a reactant comprising a dopant element and a gas reactive therewith to form the dopant gas species, said system comprising:

a source mass of said reactant, isolated from the substrate material and precursor and components thereof;

means for flowing said reactive gas in contact with the reactant mass to effect reaction and generate the dopant gas species and recovering the dopant gas species, wherein the reactive gas contacted with the reactant mass is substantially free of any precursors or components of the substrate material;

an ionization chamber arranged to receive the dopant gas species and ionize same to form ionic dopant species; and an ion implant chamber arranged to receive the ionic dopant species for ion implantation of said species in a substrate therein.

11. A system according to claim 1, further comprising means for heating the material source mass to a temperature above ambient temperature.

12. A system according to claim 11, wherein the material source mass heating means comprise means for resistance heating or radio frequency heating of the metal source mass.

13. A process for generating a dopant gas species for doping of a substrate material, comprising:

providing a source mass of reactant, isolated from the substrate material and precursors and components thereof;

flowing in contact with said reactant source mass a reactive gas to reactively etch the reactant source mass and form the dopant gas species, wherein the reactive gas contacted with the reactant mass is sustantially free of any precursors or components of the substrate material; and recovering the dopant gas species.

14. A process according to claim 13, wherein said material source mass is in the form of a solid mass.

15. A process according to claim 13, wherein said source mass of material is disposed in a reaction chamber through which the reactive gas is flowed to effect gas/metal reaction.

16. A process according to claim 15, comprising multiple material source masses.

17. A process according to claim 13, comprising flowing multiple reactive gases separately and/or in mixture in contact with the material source mass.

18. A process according to claim 17, comprising controllably mixing reactive gas from said gas sources.

19. A process according to claim 13, wherein said material is selected from the group consisting of germanium, antimony, indium, and arsenic.

20. A process according to claim 13, wherein said material source mass is a metal rod, disposed in a reaction chamber, with an inlet for introducing said reactive gas to the chamber, and an outlet for discharging reaction product gas.

21. A process according to claim 13, wherein said reactive gas is selected from the group consisting of $NF_3$, $ClF_3$, $CF_3I$, $CF_3H$, $H_2$, $NH_3$, HF, $BF_3$, $F_2$, $Cl_2$, $SiF_4$, and mixtures of two or more species thereof.

22. An ion implant and dopant gas species in-situ generation process for doping of a substrate material, wherein the dopant gas species is a reaction product of a reactant, and a gas reactive therewith to form the dopant gas species, said process comprising:

providing a source mass of said reactant, isolated from the substrate material and precursors and components thereof;

flowing said reactive gas in contact with the reactant mass to effect reaction and generate the dopant gas species and to recover the dopant gas species, wherein the reactive gas contacted with the reactant mass is substantially free of any precursors or components of the substrate material;

ionizing the recovered dopant gas species to form ionic dopant species; and implanting the ionic dopant species in the substrate.

23. A process according to claim 13, further comprising heating the material source mass to a temperature above ambient temperature.

24. A process according to claim 13, wherein the material source mass heating means comprise means for resistance heating or radio frequency heating of the metal source mass.

25. A process according to claim 13, further comprising flowing the dopant gas species to a chemical vapor deposition chamber for incorporation in an epitaxially grown film.

26. A process according to claim 13, further comprising flowing the dopant gas species to an ionization chamber of an ion implant apparatus, for generation of ionic dopant species, and directing such species to a substrate for implantation therein.

27. A process according to claim 13, wherein the material source mass is heated to facilitate the reaction between the metal and gas.

28. An ion implantation system for ion implanting a dopant element in a substrate, comprising:

a source mass of material comprising the dopant element to be ion implanted in the substrate;

a source of a gas etchant arranged for flow of the gas etchant in contact with the source mass of material under etch conditions to yield a vapor containing a compound of said dopant element;

an ionization chamber arranged in receiving relationship to said vapor, for ionization of the dopant element in said vapor to form an ionic dopant species comprising said dopant element; and an ion implanter arranged in receiving relationship to the ionic dopant species, for implantation of the dopant element in the substrate.

29. A system according to claim 28, further comprising means for heating the source mass of material by radio frequency heating.

30. A system according to claim 28, wherein said gas etchant comprises a fluorine-containing gas.

31. A system according to claim 28, wherein said dopant element is selected from the group consisting of Ge, Sb, As, P, In and B.

32. A system for generating a dopant gas species for ion implantation in a substrate, wherein the dopant gas species is a reaction product of a reactant comprising a dopant element selected from the group consisting of Ge, Sb, As, P, In and B, and a gas reactive with the reactant to form the dopant gas species, wherein said gas comprises a fluorine-containing gas, said system comprising:

a source mass of said reactant;

means for flowing the fluorine-containing gas in contact with said reactant to effect reaction and generate said dopant gas species; and an ionizer and implanter unit, arranged for ionization of the dopant gas species and implantation of ionized dopant element in the substrate.

33. An ion implantation process for ion implanting a dopant element in a substrate, comprising:

providing a source mass of material comprising the dopant element to be ion implanted in the substrate;

contacting the source mass of material with a gas etchant under etch conditions to yield a vapor containing a compound of said dopant element;

ionizing the dopant element in said vapor to form an ionic dopant species comprising said dopant element; and implanting the dopant element in the substrate.

34. A process according to claim 33, further comprising heating the source mass of material by radio frequency heating.

35. A system according to claim 33, wherein said gas etchant comprises a fluorine-containing gas.

36. A process according to claim 33, wherein said dopant element is selected from the group consisting of Ge, Sb, As, P, In and B.

37. A process for generating a dopant gas species for ion implantation in a substrate, wherein the dopant gas species is a reaction product of a reactant comprising a dopant element selected from the group consisting of Ge, Sb, As, P, In and B, and a gas reactive with the reactant to form the dopant gas species, wherein said gas comprises a fluorine-containing gas, said process comprising:

providing a source mass of said reactant;

flowing the fluorine-containing gas in contact with said reactant to effect reaction and generate said dopant gas species;

ionizing the dopant gas species; and implanting ionized dopant element in the substrate.

* * * * *

UNITED STATES PATENT AND TRADEMARK OFFICE
CERTIFICATE OF CORRECTION

PATENT NO.   : 6,001,172
DATED        : December 14, 1999
INVENTOR(S)  : Gautam Bhandari; W. Karl Olander; Michael A. Todd; Timothy Glassman It is certified that error appears in the above-identified patent and that said Letters Patent is hereby corrected as shown below:

Column 8,
Line 26: change "claim" to -- claimed --.
Lines 36-38: after "species" delete ", wherein the reactive gas contacted with the reactant mass is substantially free of any precursors or components of the substrate material".

Column 9,
Lines 5-8: after "species" delete ", wherein the reactive gas contacted with the reactant mass is substantially free of any precursors or components of the substrate material".
Lines 28-30: after "species" delete ", wherein the reactive gas contacted with the reactant mass is substantially free of any precursors or components of the substrate material."
Line 68: after "species" delete ", wherein the reactive gas contacted with the reactant mass is substantially free of any precursors or components of the substrate material".

Signed and Sealed this

Twenty-first Day of August, 2001

*Attest:*

NICHOLAS P. GODICI
*Attesting Officer*   Acting Director of the United States Patent and Trademark Office